(12) United States Patent
Ngo

(10) Patent No.: US 6,798,213 B2
(45) Date of Patent: Sep. 28, 2004

(54) CIRCUIT ANALYZER WITH COMPONENT TESTING CAPABILITY

(75) Inventor: Kiet Ngo, London (CA)

(73) Assignee: OES, Inc., London (CA)

( * ) Notice: Subject to any disclaimer, the term of this patent is extended or adjusted under 35 U.S.C. 154(b) by 88 days.

(21) Appl. No.: 10/208,889

(22) Filed: Jul. 30, 2002

(65) Prior Publication Data
US 2004/0021471 A1 Feb. 5, 2004

(51) Int. Cl.$^7$ .............................................. G01R 31/12
(52) U.S. Cl. ..................................... 324/548; 324/686
(58) Field of Search ................................. 324/686, 548

(56) References Cited

U.S. PATENT DOCUMENTS

| | | | |
|---|---|---|---|
| 3,975,680 A | * | 8/1976 | Webb ........................... 324/686 |
| 4,056,105 A | * | 11/1977 | Ravas ........................... 607/17 |
| 6,054,864 A | | 4/2000 | Butts |
| 6,169,395 B1 | | 1/2001 | King |
| 6,191,723 B1 | | 2/2001 | Lewis |
| 6,198,290 B1 | | 3/2001 | Krinker |
| 6,275,326 B1 | | 8/2001 | Bhalla et al. |

* cited by examiner

Primary Examiner—Charles H. Nolan, Jr.
(74) Attorney, Agent, or Firm—Carlson, Gaskey & Olds

(57) ABSTRACT

An electrical assembly testing device includes the capability of testing for specific components of interest. A sample component and the component of interest receive a test signal from a test signal generator. An output from each component in response to the test signal is utilized by a controller to determine a relationship between the outputs. The determined relationship between the outputs provides information regarding the component of interest so that the controller can make a determination whether the component is acceptable or whether it fails to meet selected criteria. In one example, a device designed according to this invention is particularly well suited for testing capacitors within wire harness assemblies.

26 Claims, 3 Drawing Sheets

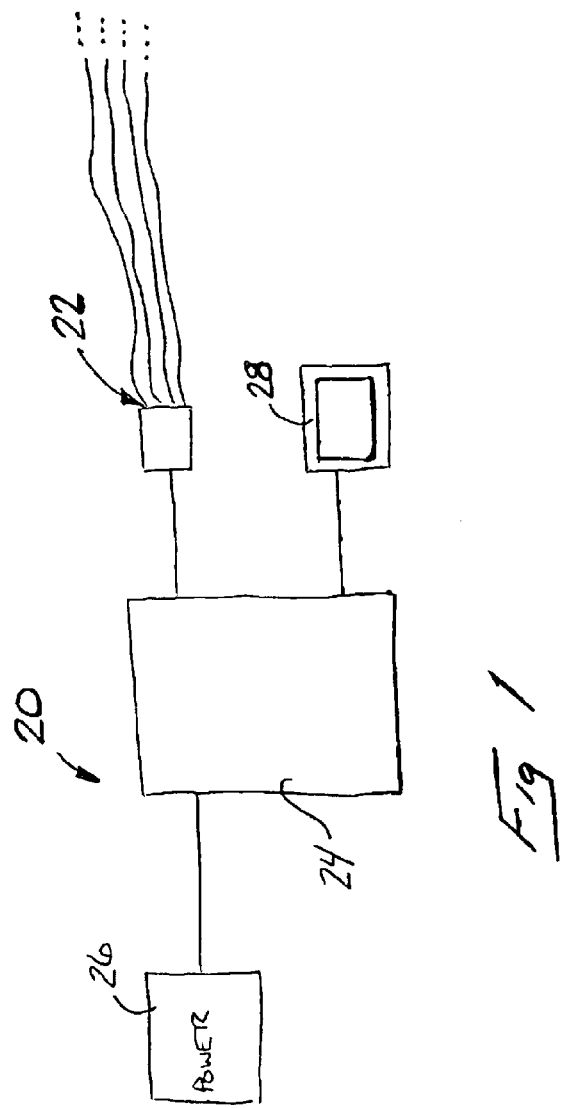

CIRCUIT ANALYZER WITH COMPONENT TESTING CAPABILITY

BACKGROUND OF THE INVENTION

This invention generally relates to analyzing electrical circuits such as wire harness assemblies. More particularly, this invention relates to a circuit analyzer arrangement having the capability of testing for one or more selected components of interest.

Circuit analyzers are used for a variety of purposes. One particular application is for testing wire harnesses to verify the integrity of a wire harness assembly. Many analyzers used for such purposes only test conductivity between expected points in the wire harness. More complicated analyzers are available to detect the presence of capacitors, resistors or diodes, for example. While such devices are available, they are typically prohibitively expensive and complicated or cumbersome to use. Moreover, the timing constraints placed on such devices renders them economically disadvantageous in a typical manufacturing concern. Accordingly, most conventionally used wire harness testing devices are not capable of detecting discrete components such as capacitors, resistors or combinations of active and passive devices within the harness assembly. As a result, each wire harness having a capacitor or other similar device typically must be manually checked using special test meters.

The conventional method of using such meters, while ultimately effective, has several shortcomings and drawbacks. The typical approach for testing a capacitor, for example, includes measuring the rise time of the capacitor. This introduces additional time during the assembly or manufacturing process, which is considered economically disadvantageous. Moreover, any resistance present within the circuit has an effect on the rise time and places constraints on the testing conditions for measuring the capacitor. Further, any stray resistance may not be accounted for while it has an adverse impact on the test results. In longer wire harness assemblies, stray resistance is a particular problem. Still further, in situations where resistors or other devices are in the wire harness assembly in combination with the capacitors, the conventional method of testing for capacitance is not capable of providing useful results.

This invention provides a significant advance in the art of analyzing a circuit or specific components within a circuit. This invention provides accurate, reliable, economical testing results while avoiding the shortcomings and drawbacks of the prior art.

SUMMARY OF THE INVENTION

In general terms, this invention is a device for testing an electrical circuit assembly having at least one component of interest. The inventive device facilitates gathering information to verify a chosen feature of the component of interest.

A device designed according to this invention includes a sample component that has a known characteristic. A test signal generator provides a pulse signal to the sample component and to the component of interest. A controller determines a relationship between an output from the sample component and an output from the component of interest. The determined relationship provides an indication regarding the component of interest so that the chosen feature of the component of interest may be verified or analyzed.

In one method according to this invention, the test signal is provided to a sample component and the component of interest when the components are in a series relationship. An output signal from each component, which in one example is a voltage across the component, is used to determine a relationship between the respective component responses to the test signal. This relationship provides information regarding the component of interest so that a desired determination can be made.

The various features and advantages of this invention will become apparent to those skilled in the art from the following detailed description of the currently preferred embodiments. The drawings that accompany the detailed description can be briefly described as follows.

DETAILED DESCRIPTION OF THE PREFERRED EMBODIMENTS

Figure 1:
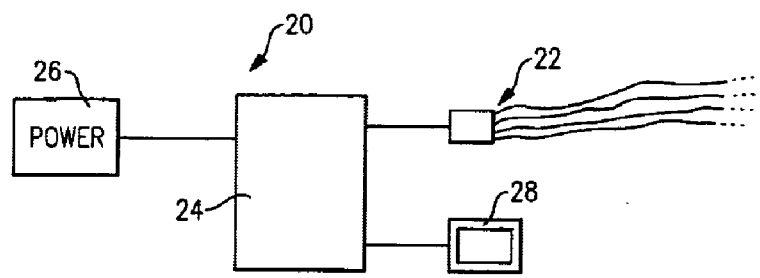
FIG. 1 schematically illustrates a system designed according to this invention.
Figure 2:
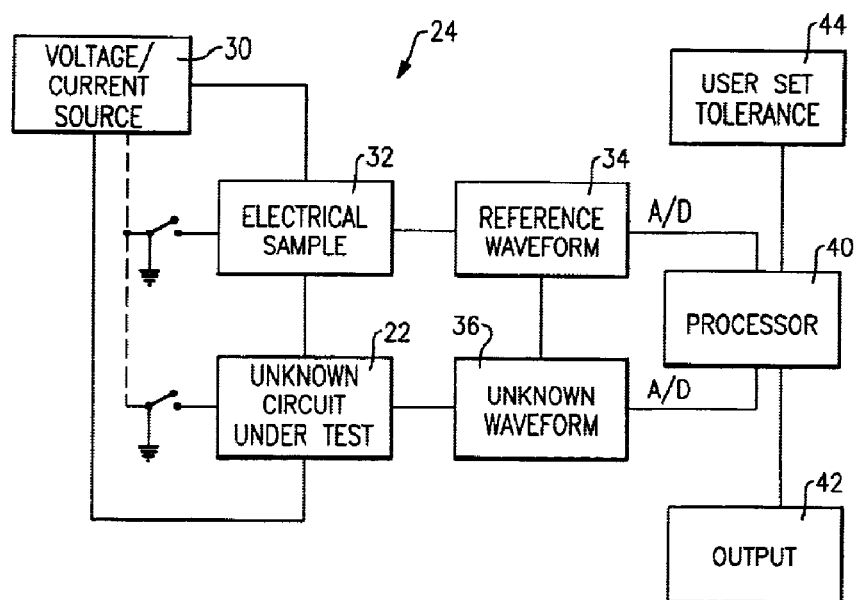
Figure 3:
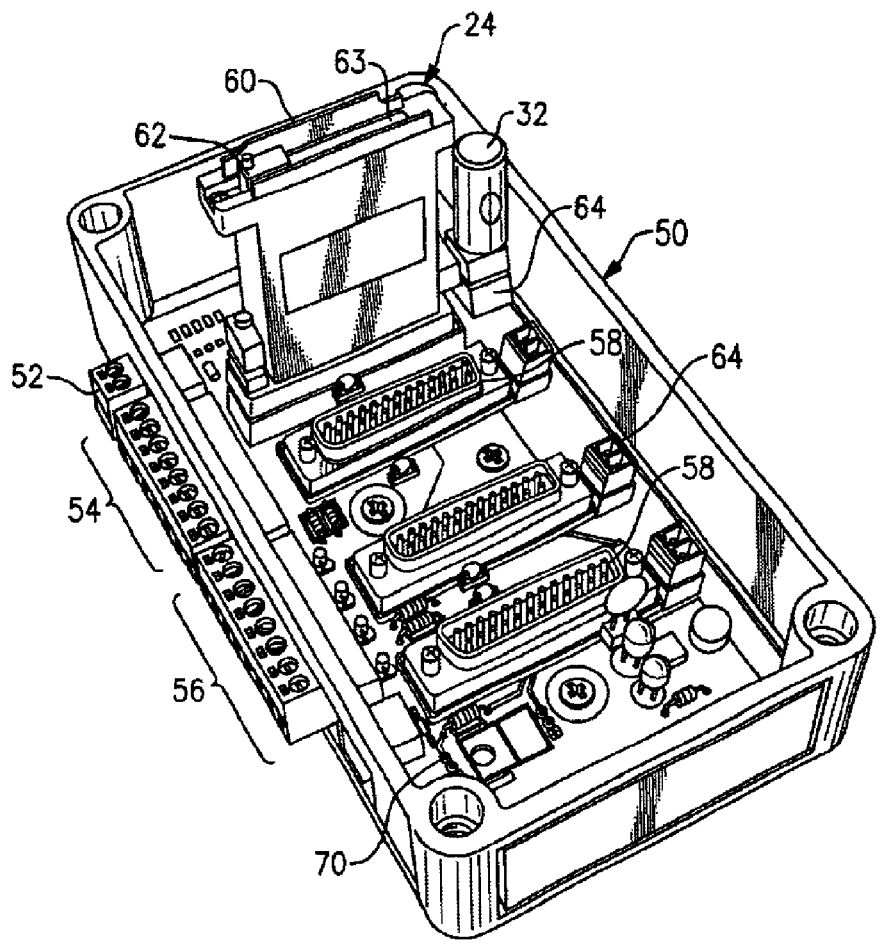

Referring to FIG. 1, an electrical circuit assembly testing system 20 is useful for testing the integrity or contents of an electrical assembly 22. The illustrated example includes a wire harness assembly as the electrical assembly 22. While a device designed according to this invention is particularly well suited for the wire harness industry, this invention is not so limited. Those skilled in the art who have the benefit of this description will realize the various applications for the inventive arrangement.

A testing device 24 receives power from a conventional power source 26 to test at least one component of interest associated with the electrical assembly 22. The results obtained by the testing device 24 may be fed, for example, to a computer 28 to provide an output indicating the test results. Additionally, output from the testing device 24 can be fed to the computer memory to track quality control issues over time, for example.

Figure 2:
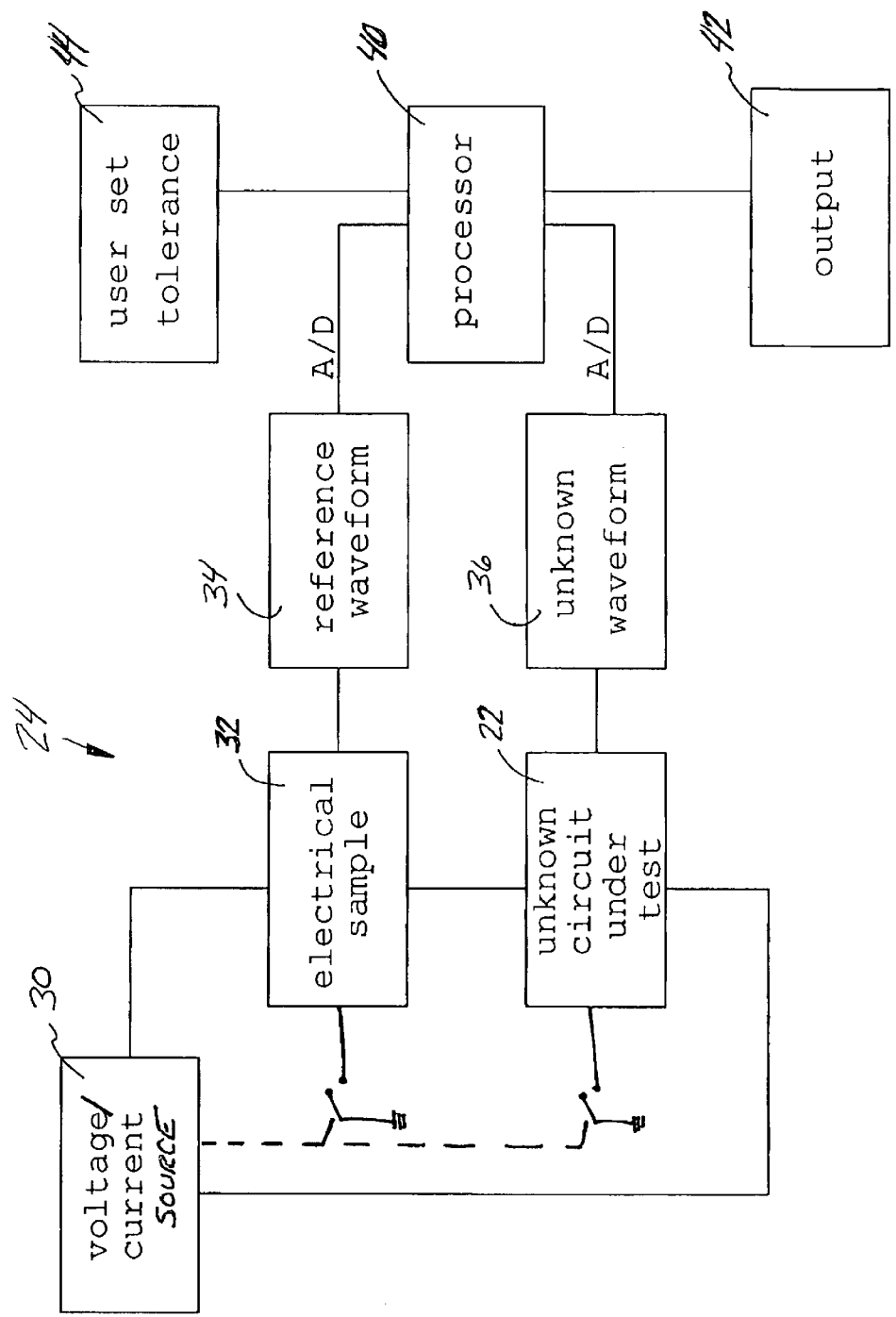
FIG. 2 schematically illustrates, in somewhat more detail, selected portions of the embodiment of FIG. 1.

As best appreciated from FIG. 2, the testing device 24 includes a test signal generator 30. Depending on the component of interest and the characteristics of such a component or collection of components, the test signal generator 30 may comprise a voltage source or a current source, for example. In one particular example which is well suited for testing capacitors in the range from 1000 pf to 10,000 uf, the test signal source 30 provides a five volt DC pulse test signal having a 75 millisecond duration. A significant advantage of this invention is the reduced time it takes to test a circuit component. With a pulse test signal, an instantaneous response is available for analysis.

The testing device 24 includes a sample component 32 that receives the test signal from the source 30. The sample component 32 is chosen to have a known characteristic that provides a response to the test signal similar to the response expected from the component of interest in the electrical assembly 22. In one example, the component of interest is a capacitor and, therefore, the sample component 32 is a capacitor. It is not necessary that the sample component capacitor 32 have the same capacitance as the capacitor of interest, although providing a sample capacitor having the expected capacitance may provide some advantages as will become apparent from the description that follows.

The signal from the source 30 is provided to the sample component 32 and the component of interest that is part of the assembly 22. An output 34 from the sample component 32 and an output 36 from the component of interest within the assembly 22 preferably are processed through conventional analog to digital converters so that the outputs may be utilized by a controller 40. The controller 40 may comprise a microprocessor, for example. The controller 40 preferably is programmed to determine a relationship between the output 34 of the sample component 32 and the output 36 of the component of interest that is part of the assembly 22. The relationship between those outputs provides the controller 40 the ability to determine whether the component of interest is acceptable. The controller 40 preferably is programmed to make the determination based upon selected criteria, which depends in part upon the nature of the component of interest. The controller 40 preferably provides an output 42 indicating the results of the test.

In one preferred embodiment, a tolerance setting mechanism 44 is included to allow a user to set the level of tolerance that the controller 40 will utilize to make determinations regarding the acceptability of the component of interest.

In one example, the sample component 32 and the component of interest are capacitors. This invention utilizes the known capacitor model: C=Q/V where C is the capacitance measured in Farads. This invention includes the realization that for the same charge value Q, a larger capacitor provides a smaller voltage output and a smaller capacitor provides a larger voltage output. The sample component capacitor in the testing device 24 in this example preferably is put in series with the capacitor of interest in the assembly 22 so that the same charge is applied to both capacitors. If the capacitors have the same capacitance value, the voltage across each is the same. Therefore, the outputs 34 and 36 are processed by the controller 40 so that the controller determines them to be equal. If the capacitor of interest within the assembly 22 is smaller than the sample capacitor 32 then the voltage output 36 will be higher than the output 34. The converse is true if the capacitor of interest within the assembly 22 has a larger capacitance than the sample capacitor 32. This relationship between the voltages across the capacitors which are responsive to the test signal, preferably is utilized by the controller 40 to make a determination regarding the capacitance of the unknown capacitor of interest in the wire harness assembly 22.

A significant advantage to this invention is that the comparison made by the controller 40 does not require specific knowledge of actual capacitance and does not depend upon the rise time of the capacitor. Therefore, the same time that it takes to check a 10,000 uF capacitor provides results when checking a 0.0001 uF capacitor.

Additionally, a device designed according to this invention has a tolerance for accepting or rejecting a component of interest that is universal and independent of the specific capacitance value.

Taking an example where a 5 volt DC pulse test signal of 75 milliseconds duration is applied to the capacitors, a 2.5 volt output 34 and a 2.5 volt output 36 indicate that the unknown capacitor has the same value as the sample capacitor 32. A change in the compared values of 0.25 volts, for example, accurately represents a tolerance of ten percent. This same tolerance holds true for the entire range of capacitors (assuming that the sample capacitor 32 is sized to be the same as the expected capacitor in the circuit of interest). Such an arrangement eliminates the need to store set points for different ranges of components and greatly simplifies calibration that is required for other types of measuring devices. Moreover, a device designed according to this invention does not lose accuracy because of resistance that may be purposefully or unintentionally present in a wire harness assembly. Any resistance in series with the capacitor prevents conventional methods from working because such resistance affects the charge and discharge time of the capacitor. With the inventive device, however, applying the same charge to both capacitors allows the controller 40 to make the necessary determination to accurately test the component of interest regardless of stray resistance, for example.

The illustrated example includes resetting switches 46 and 48, such as relays, for selectively discharging the sample component and the component of interest prior to and after testing. A variety of discharging arrangements fit within the scope of this invention.

The previous example discusses a capacitor as the component of interest. Other types of components such as resistors or inductors may be tested in a similar manner. Moreover, combinations of discrete circuit elements may be tested by providing a sample component that comprises similarly situated circuit elements so that the behavior of the sample component and that of the component of interest can be compared and processed to make the appropriate determination. Given this description, those skilled in the art will be able to develop specific test signals and the programming necessary so that the controller 40 can achieve the desired results.

One advantage of this invention is that it provides a modular approach that can be readily incorporated into other testing equipment. For example, the system 20 schematically illustrated in FIG. 1 may include conventional wire harness testing equipment including the power source 26 and the computer 28. The module testing device 24 may be incorporated as part of such a device for not only checking the conductivity of the wire harness 22 but for also checking specific components of interest as may be needed.

Figure 3:
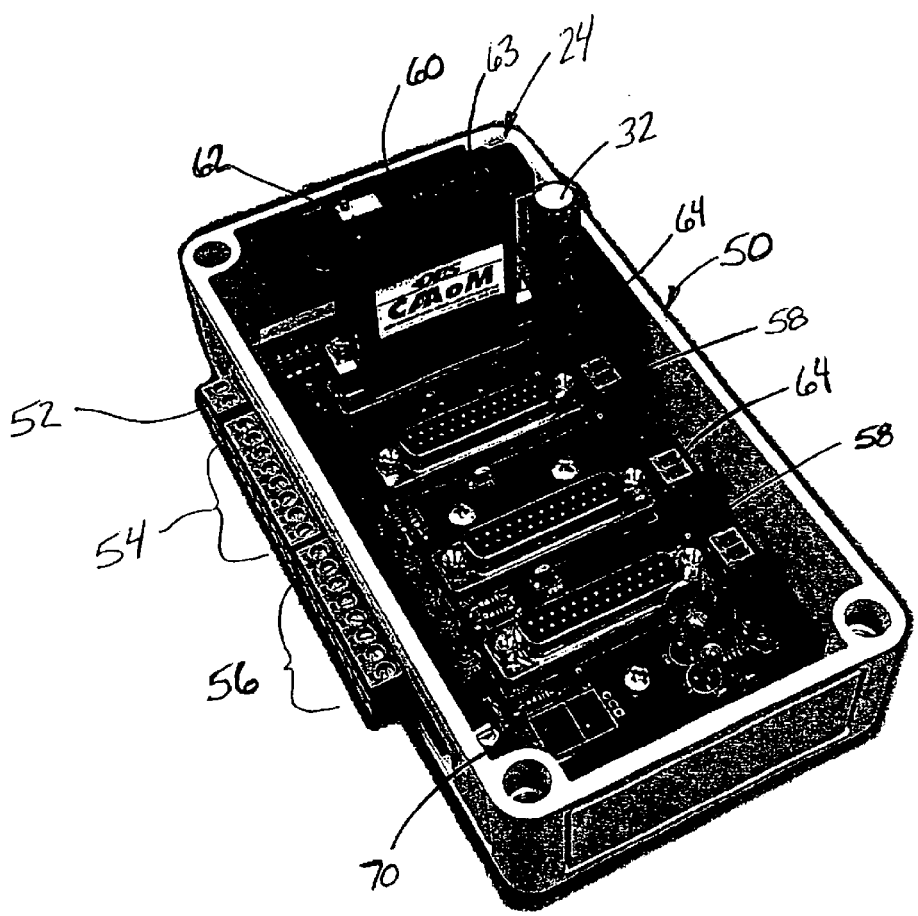
FIG. 3 diagrammatically illustrates one example embodiment of selected portions of a system designed according to this invention.

FIG. 3 diagrammatically illustrates one embodiment of a testing device 24 designed according to this invention. In this example, a housing 50 supports a plurality of elements making up the testing device 24. A plurality of inputs 52 allow the device to be coupled to a conventional power source 26. A second set of inputs 54 allow the device 24 to be coupled to one or more electrical assemblies 22, such as wire harnesses The second set of inputs may be coupled anywhere in the assembly 22 that suits the needs of a given situation. For example, the inputs 54 may be coupled with a connection port of the wire harness assembly. Alternatively, testing leads may be coupled to selected portions of a circuit or a wire harness assembly. This invention provides the ability to test the capacitor or other device of interest without requiring connecting the inputs 54 "directly" to either side of the capacitor. This invention provides the capability to take testing data from a selected portion of a circuit or a wire harness assembly that includes the capacitor or other device of interest. Such versatility is one of the advantages of this invention.

A plurality of outputs 56 allow communication of the test results regarding the various components being tested.

The illustrated example includes a plurality of ports 58 that are adapted to be electrically coupled with one or more modules 60. Each module 60 includes a tolerance adjustment mechanism 62. The illustrated example includes a potentiometer that is manually set by a user to determine the desired tolerance for a particular application. The module 60 also includes a printed circuit board 63, which may support the test signal generator 30 and the controller 40, depending on the needs of a particular situation. There are a variety of ways to incorporate the various portions of the testing device 24 into a module 60 or into discrete components, depending on the preferences of a particular individual. Those skilled in the art who have the benefit of this description will realize the most efficient arrangement to suit the needs of their particular situation.

Each module 60 in the illustrated example preferably communicates with a sample component 32 through a component mounting port 64, which is supported within the housing 50. The illustrated example includes an electrolytic capacitor as the sample component 32. The module 60 includes the necessary circuitry, software, or both, to make the necessary determination based upon the determined relationship between the outputs of the sample component and the component of interest. The illustrated example device includes an output 70, which comprises an LED that provides a visible indication of an acceptable or failed component of interest, for example. The illustrated example is capable of supporting multiple modules 60 that are selectively placed into the housing 50 or interchangeable with others as may be needed to test a variety of electrical assemblies. The inventive arrangement provides a significantly enhanced testing system that is capable of testing for specific components in an accurate, reliable and economical fashion.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

I claim:

1. A device for testing an electrical assembly that includes at least one component of interest, comprising:
   a sample component having a known characteristic;
   a test signal generator that simultaneously provides a test signal to the sample component and the component of interest;
   a controller that compares a response to the test signal from the sample component and the component of interest to determine whether the component of interest meets a selected criteria.

2. The device of claim 1, wherein the sample component comprises a capacitor and the known characteristic comprises capacitance.

3. The device of claim 2, wherein the sample component is placed in series with the component of interest and the response from the sample component comprises a voltage across the sample component and the response from the component of interest comprises a voltage across the component of interest.

4. The device of claim 1, wherein the test signal generator comprises a DC pulse signal generator.

5. The device of claim 1, wherein the test signal generator applies an equal signal to the sample component and the component of interest and wherein the controller uses the response from the sample component as a baseline for comparison with the response from the component of interest.

6. The device of claim 1, wherein the sample component comprises a plurality of circuit elements that correspond to a plurality of circuit elements comprising the component of interest.

7. The device of claim 1, including a housing that supports a plurality of sample components and has a plurality of connections for coupling the electrical assembly to at least a selected one of the sample components.

8. The device of claim 7, wherein the sample components are selectively removable from the housing.

9. A method of testing an electrical assembly having at least one component of interest using a sample component having a known characteristic, comprising the steps of:
   providing a test signal to the sample component;
   simultaneously providing the test signal to the component of interest; and
   determining a relationship between a response to the test signal from the sample component and a response to the test signal from the component of interest.

10. The method of claim 9, including using the determined relationship to determine whether the component of interest meets selected criteria.

11. The method of claim 9, including coupling the sample component in series with the component of interest, applying the same charge to the components, determining a voltage across each component and using the determined voltages to determine the relationship between the responses.

12. The method of claim 9, including coupling the sample component to a wire harness assembly.

13. The device of claim 1, wherein the controller uses a response to the test signal from the sample component and the component of interest that is different than the selected criteria.

14. The device of claim 1, wherein the component of interest is at least a portion of a wire harness assembly and wherein the sample component comprises a plurality of elements corresponding to the portion of the wire harness assembly.

15. The device of claim 7, wherein the controller is part of a module that is supported within the housing and wherein the module includes a tolerance adjustment device.

16. The device of claim 15, including a plurality of the modules, each associated with one of the plurality of sample components and wherein each module includes a dedicated controller.

17. A device for testing an electrical assembly that includes at least one component of interest, comprising:
   a sample component having a known characteristic that is in series with the component of interest;
   a test signal generator that provides a test signal to the sample component and the component of interest; and
   a controller that compares a response to the test signal from the sample component and the component of interest to determine whether the component of interest meets a selected criteria.

18. The device of claim 17, wherein the controller uses a response that is different than the selected criteria.

19. The device of claim 18, wherein the response is a voltage and the selected criteria is a capacitance.

20. The device of claim 18, wherein the controller compares a relative magnitude of the response from the sample component and the response from the component of interest to determine whether the component of interest meets the selected criteria.

21. A device for testing an electrical assembly that includes at least one component of interest, comprising:
   a sample component having a known characteristic;
   a test signal generator that provides a test signal to the sample component and the component of interest;

a controller that compares a response to the test signal from the sample component and the component of interest to determine whether the component of interest has a selected characteristic and wherein the response is different than the selected characteristic.

22. The device of claim 21, wherein the selected characteristic is a capacitance and the response is a voltage.

23. The device of claim 21, wherein the controller uses a relative magnitude of the response from the sample component and the response from the component of interest to determine whether the component of interest has the selected characteristic.

24. The device of claim 21, wherein the test signal generator simultaneously provides the test signal to the sample component and the component of interest.

25. The device of claim 21, wherein the sample component is in series with the component of interest.

26. The device of claim 7, including an indicator that provides an indication whether the component of interest meets the selected criteria, the indicator being supported by the housing.

* * * * *

UNITED STATES PATENT AND TRADEMARK OFFICE
CERTIFICATE OF CORRECTION

PATENT NO. : 6,798,213 B2  Page 1 of 3
DATED : September 28, 2004
INVENTOR(S) : Ngo It is certified that error appears in the above-identified patent and that said Letters Patent is hereby corrected as shown below:

<u>Drawings,</u>
Replace drawing sheets 1-3 in the patent with the attached two sheets of formal drawings.

Signed and Sealed this

Fourteenth Day of December, 2004

JON W. DUDAS
*Director of the United States Patent and Trademark Office*